United States Patent
Hogeboom et al.

(10) Patent No.: US 8,754,682 B2
(45) Date of Patent: Jun. 17, 2014

(54) FRACTIONAL DIVIDER FOR AVOIDANCE OF LC-VCO INTERFERENCE AND JITTER

(75) Inventors: John Hogeboom, Ottawa (CA); Pat Hogeboom-Nivera, legal representative, Ottawa (CA); Anton Pelteshki, Carleton Place (CA)

(73) Assignee: STMicroelectronics (Canada) Inc., Ottawa, Ontario (CA)

( * ) Notice: Subject to any disclaimer, the term of this patent is extended or adjusted under 35 U.S.C. 154(b) by 0 days.

(21) Appl. No.: 13/450,280

(22) Filed: Apr. 18, 2012

(65) Prior Publication Data

US 2012/0268177 A1      Oct. 25, 2012

Related U.S. Application Data

(60) Provisional application No. 61/477,994, filed on Apr. 21, 2011.

(51) Int. Cl.
*H03L 7/06*      (2006.01)

(52) U.S. Cl.
USPC ............... 327/147; 331/57; 331/76; 327/156; 327/161

(58) Field of Classification Search
USPC ...................... 327/141, 144–163; 331/15–17; 375/373–376
See application file for complete search history.

(56) References Cited

U.S. PATENT DOCUMENTS

| | | | |
|---|---|---|---|
| 2001/0005158 A1* | 6/2001 | Okayasu | 327/277 |
| 2005/0226357 A1* | 10/2005 | Yoshimura | 375/376 |
| 2008/0088379 A1* | 4/2008 | Chen | 331/57 |
| 2010/0259305 A1* | 10/2010 | Lee et al. | 327/157 |
| 2011/0148484 A1* | 6/2011 | Kim et al. | 327/148 |
| 2012/0161827 A1* | 6/2012 | Madeira et al. | 327/147 |

* cited by examiner

*Primary Examiner* — Brandon S Cole
(74) *Attorney, Agent, or Firm* — Hogan Lovells US LLP

(57) ABSTRACT

A fractional rate LC VCO and compensating divider circuit to avoid bit-rate interference includes an LC PLL having an input for receiving a reference clock signal, an N-stage ring VCO with rotating injection having an input coupled to an output of the LC PLL and an output for providing an output clock signal, a first divider circuit having an input coupled to an output of the N-stage ring VCO and an output coupled to the LC PLL, a second divider circuit having an input coupled to the output of the LC PLL, and an M-stage reference ring PLL having an input coupled to an output of the second divider and an output coupled to the N-stage ring VCO.

20 Claims, 5 Drawing Sheets

FRACTIONAL DIVIDER FOR AVOIDANCE OF LC-VCO INTERFERENCE AND JITTER

RELATED APPLICATION

The present invention claims priority from U.S. Provisional Patent Application Ser. No. 61/477,994 filed Apr. 21, 2011, and is incorporated herein by reference in its entirety for all purposes as if fully set forth herein.

FIELD OF THE INVENTION

The present invention relates to Serializer-Deserializer ("SerDes") circuits and applications, and more specifically, low-noise clock generation therein.

BACKGROUND OF THE INVENTION

In SerDes applications, or any application requiring a low noise (low jitter) master clock of very high frequency, it is usual to require synchronism with a common, distributed, high stability reference clock of much lower frequency. To do this, a VCO and other elements needed to form a PLL are used. However, the reference clock only regulates frequency and jitter in a frequency band much lower than the reference frequency, so the VCO must be responsible for the noise and jitter at all higher frequencies up to the master clock frequency. The type of VCO with lowest noise that is readily available in integrated circuit environments is an LC type, based on the resonance of a capacitor in parallel with an inductor, both of which can be built with relatively high quality (Q) factors, i.e., low energy loss per cycle, using standard available circuit layers. However, the inductor is a relatively large conductor loop which forms an effective antenna that is relatively sensitive to electric and particularly to magnetic fields from any source, particularly nearby electrical circuits. Since the LC circuit is designed to achieve a high Q factor to minimize noise by minimizing bandwidth, the circuit is primarily sensitive to frequencies centered on the LC resonant frequency and lying within the bandwidth of the VCO circuit, which is typically no more than about 0.05% of the resonant frequency. Hence, the best means of avoiding interference is to use a resonant frequency that is not near to any of the primary or secondary frequencies used or produced by nearby circuitry. Because the purpose of the VCO is to provide the clocks for all such nearby circuitry, this means some method of shifting the VCO frequency by some non-trivial factor must be used, and in particular an integer factor such as 2 or ½ must not be used. Rather, a factor of 1.5, 1.2, or even better 0.8 is best to avoid all significant harmonics and sub-harmonics. A relatively low frequency is desirable because generally at high resonant frequencies Q falls with frequency while power increases. For similar reasons, even the master clock does not operate at the full bit-rate; rather, it operates at ½ bit-rate so that each half-period defines one bit-period, and every clock edge is fully and equally used.

SUMMARY OF THE INVENTION

A fractional rate LC VCO and compensating divider circuit to avoid bit-rate interference comprises an LC PLL having an input for receiving a reference clock signal, an N-stage ring VCO with rotating injection having an input coupled to an output of the LC PLL and an output for providing an output clock signal, a first divider circuit having an input coupled to an output of the N-stage ring VCO and an output coupled to the LC PLL, a second divider circuit having an input coupled to the output of the LC PLL, and an M-stage reference ring PLL having an input coupled to an output of the second divider and an output coupled to the N-stage ring VCO.

BRIEF DESCRIPTION OF THE DRAWINGS

FIG. 5 shows a main ring unit circuit associated with the circuit of FIG. 2.

DETAILED DESCRIPTION

Figure 1:
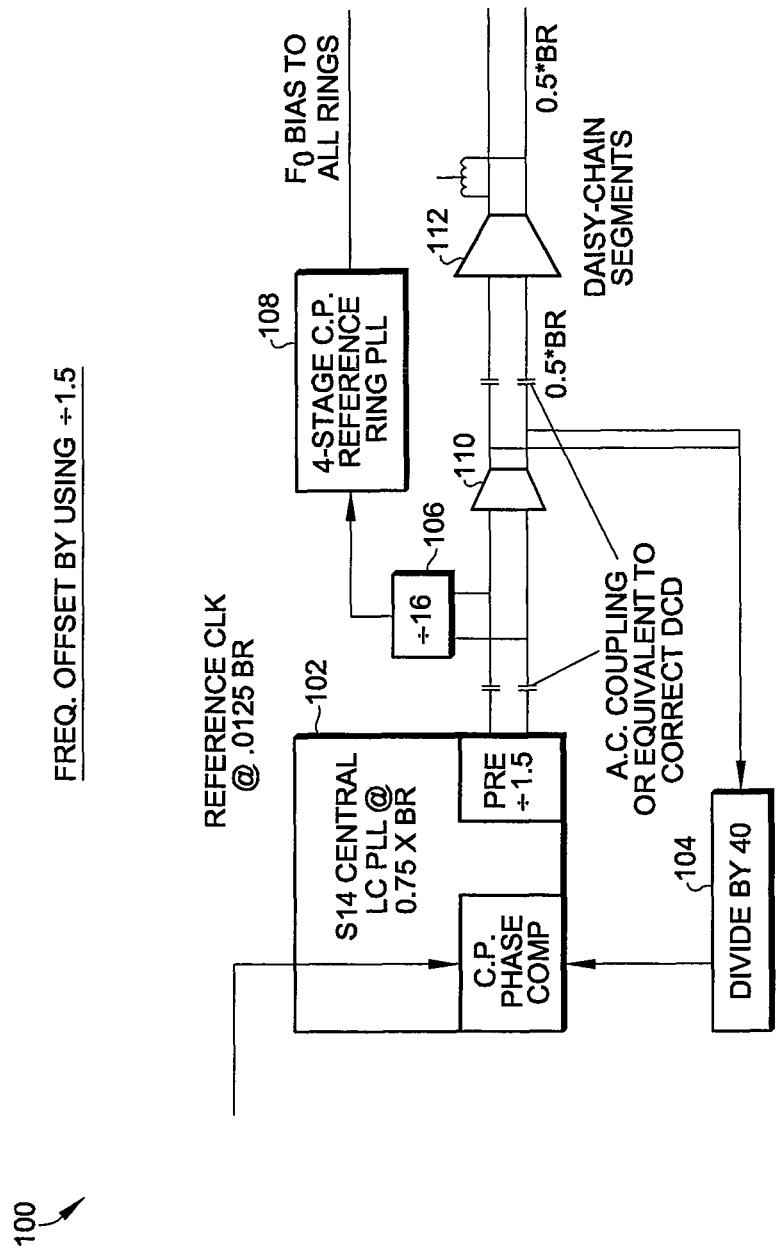
FIG. 1 shows a circuit for providing a frequency offset by using a divide by 1.5 circuit according to a first embodiment of the invention.

Referring now to FIG. 1, a block diagram 100 is entitled "Freq. Offset by Using ÷1.5", a 75% bit-rate PLL 102 with a divide by 1.5 circuit is shown producing the required 50% bit-rate master clock, with a reference ring PLL 108 generating bias voltages used to control secondary ring VCOs so they will also have free running frequency close to the 50% bit-rate. If the divide by 1.5 is removed and the LC tank frequency is reduced to 0.5 of the bit-rate, this circuit becomes the standard one that would be used if interference with the tank was not an issue. (Secondary ring VCOs use the 50% bit-rate clock to precisely injection lock their phase, and are used because they provide multiple phases, usually 8, so any adjacent pair of phases can be mixed in various ratios to achieve many phases, typically 128 phases spanning one complete clock cycle. Having 128 digitally selectable phases allows digital phase control for aligning transmit phase and for implementing digital clock and data recovery (CDR) in the receiver.) The problem with using a divide by 1.5 is that it is a difficult circuit to implement, and such a circuit will almost certainly place higher performance demands on the technology and produce poor duty-cycle balance on its output clock. For these reasons, two stages of AC coupling with switching point feedback are shown to reduce the duty-cycle distortion. The divide by 40 circuit 104 fed by the ½ bit-rate clock produces the 1/80 rate feedback clock needed for comparison with the 1/80 rate reference clock to allow the PLL to lock to the precise average frequency desired for synchronous system operation.

Frequency divider 106 is used here to provide a more practical lower frequency as a reference clock to a ring PLL. CML buffer 110 is used for boosting the driving strength of the clock signal in the loop of an LC-PLL. CML repeater 112 is in a chain of repeaters in a feed-forward clock-distribution path.

Figure 2:
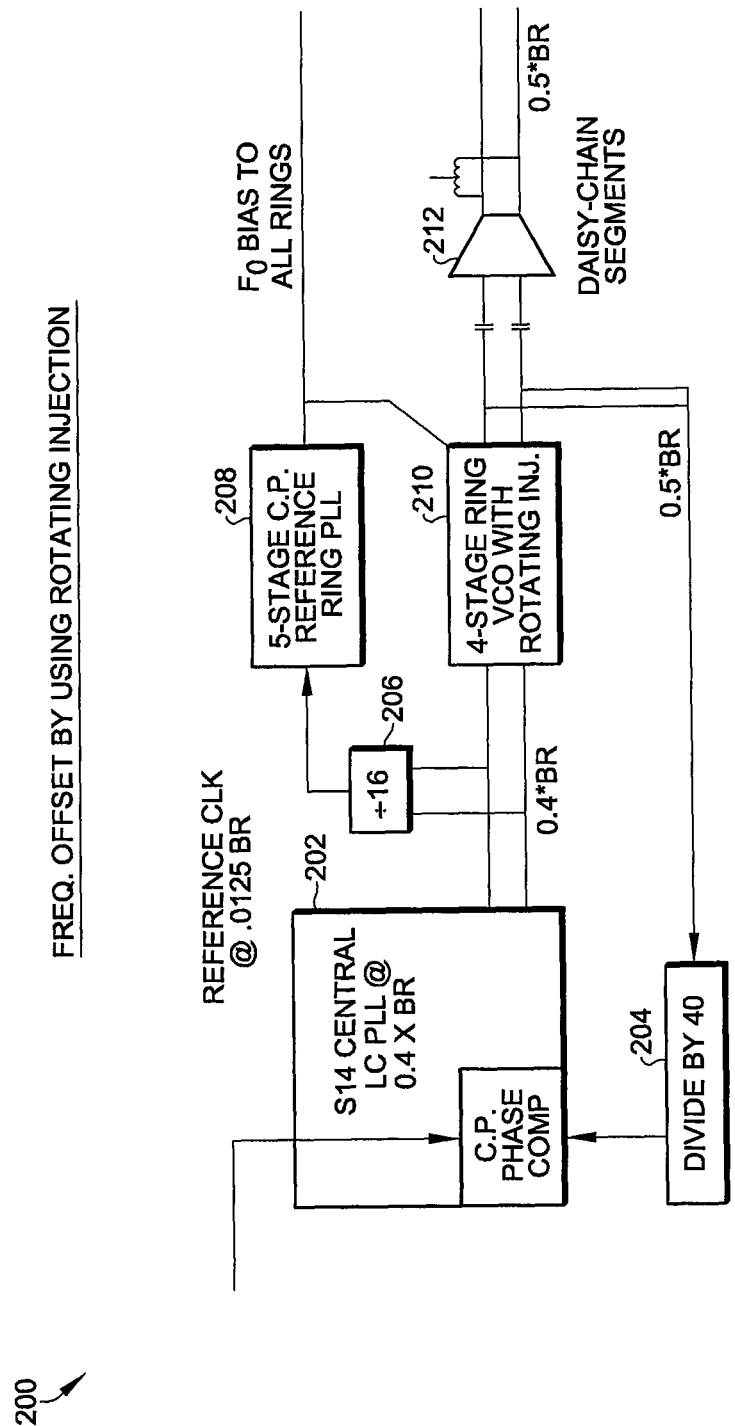
FIG. 2 shows a circuit for providing a frequency offset using rotating injection according to a second embodiment of the invention.

Referring now to FIG. 2, a block diagram 200 entitled "Freq. Offset Using Rotating Injection", is an alternate circuit block shown for producing the 50% bit-rate master clock and the same ring VCO bias voltages, but using an LC PLL 202 with a resonant tank frequency of only 40% of the bit-rate rate rather than the former 75%. The other required differences, besides removal of the divide by 1.5 circuit, are substitution of the four-stage reference ring VCO 210 with a 5-stage reference ring VCO 208 so it will run at 0.8 of the frequency using exactly the same delay per stage. The addition of a second ring VCO 210 with four stages plus a small injection stage in parallel with each main stage, and a four-latch (two-flop) divider ring is used to switch the injection stages in a rotary manner. The main element of the ring VCOs in all cases is the same, and dummy loading is always added to match the loading on all rings as best possible.

The circuit 200 of FIG. 2 comprises an LC PLL 202 having an input for receiving a reference clock signal, an four-stage ring VCO 210 with rotating injection having an input coupled to an output of the LC PLL 202 and an output for providing an output clock signal, a first divider circuit 204 having an input coupled to an output of the four-stage ring VCO and an output coupled to the LC PLL 202, a second divider circuit 206 having an input coupled to the output of the LC PLL 202, and a five-stage reference ring PLL 208 having an input coupled to an output of the second divider 206 and an output coupled to the four-stage ring VCO 210.

Figure 6:
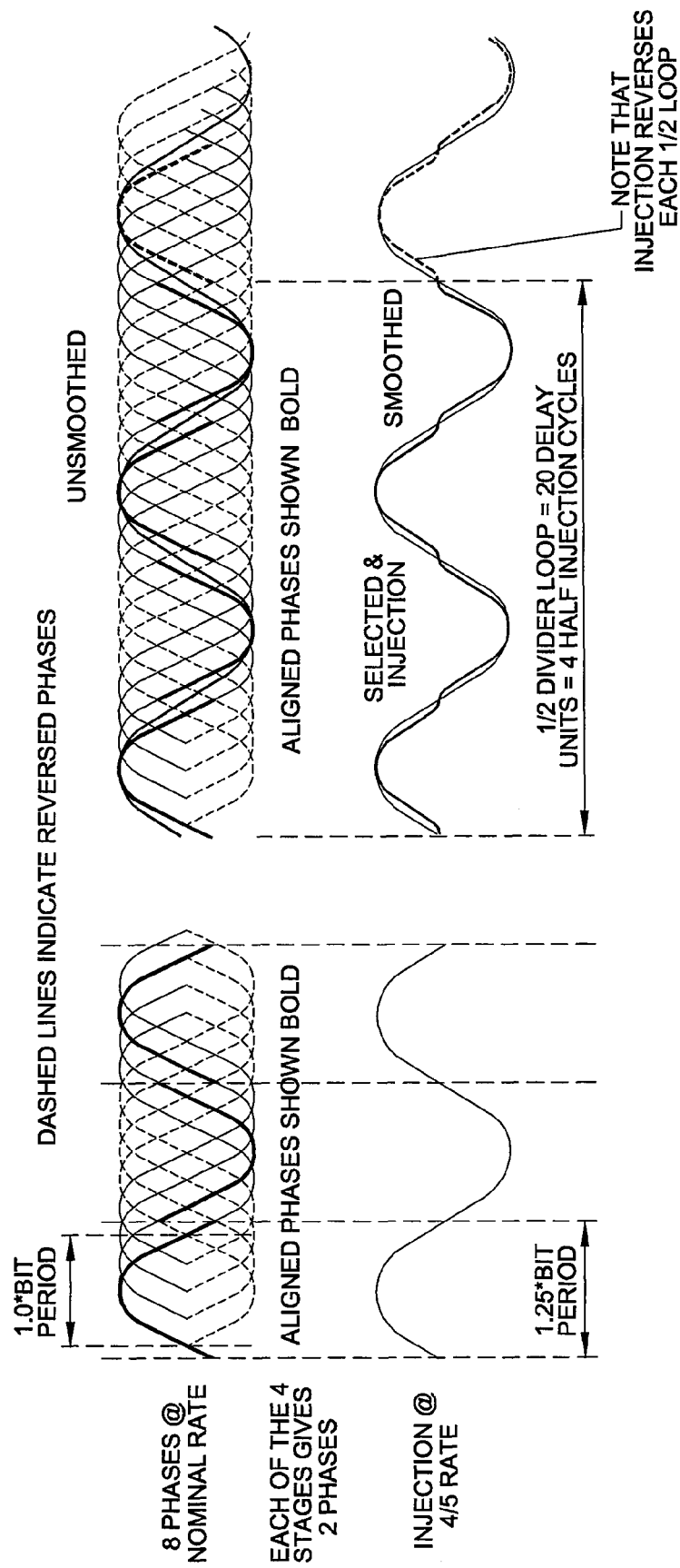
FIG. 6 shows a timing diagram associated with the circuit of FIG. 2.

Operation of the 0.8 divider ring is depicted in the waveforms shown in FIG. 6. In the waveforms to the left, the eight phases of the ring VCO and the 40% bit-rate injection signal are shown. To use this injection signal it is necessary to move the injection point forward by 25% every cycle of the transition that propagates through the VCO ring, i.e., by one stage every four stage delays. One complete clock period, of course, requires one rising edge and one falling edge to propagate through the ring, so the full period of the 50% bit-rate clock is eight delay units, while the full period of the injection signal is ten delay units. In all cases the ring delay unit is ¼ bit period.

Figure 4:
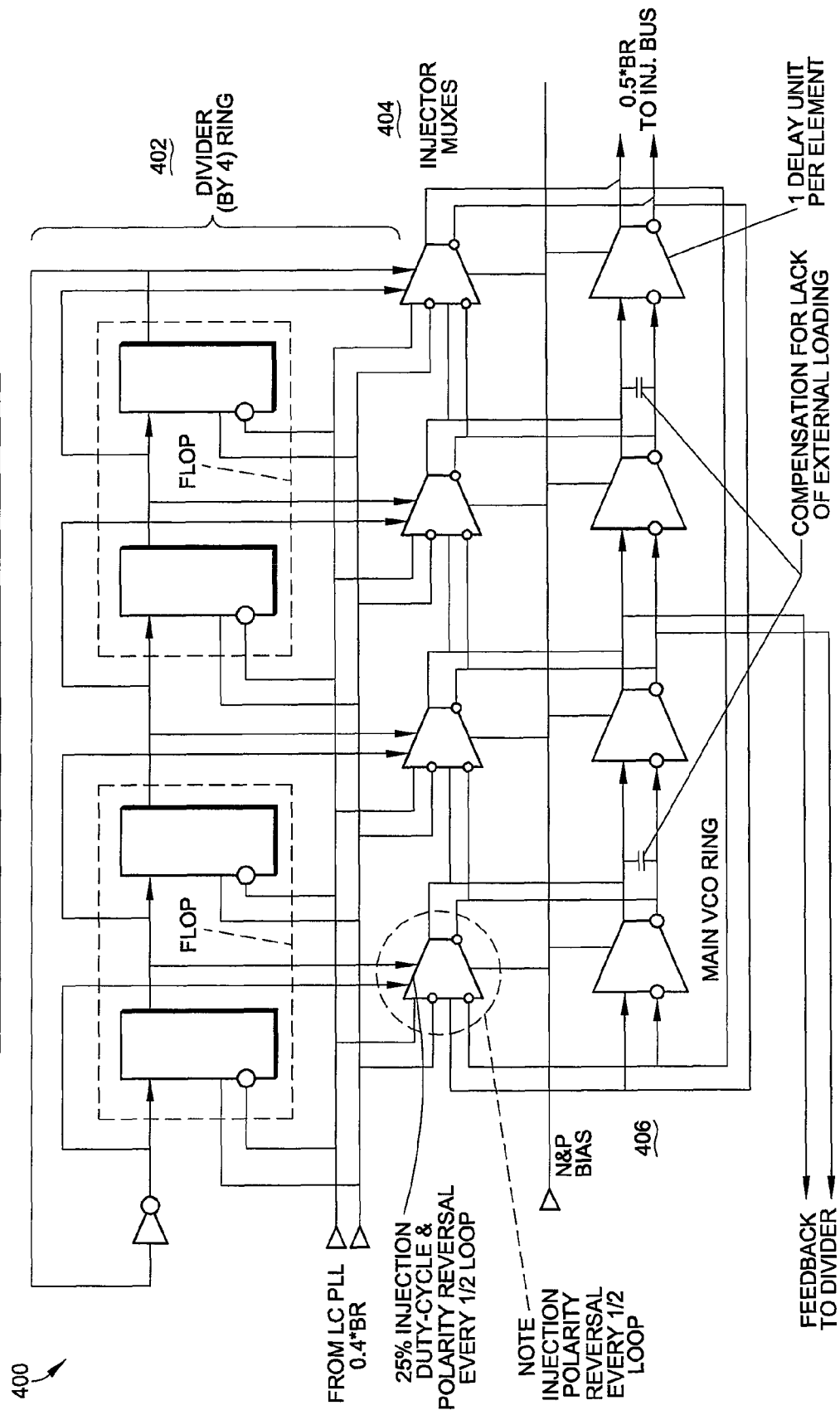
FIG. 4 shows a four-stage ring VCO circuit with a rotating 4/5 injection frequency associated with the circuit of FIG. 2.

The ring VCO 210 is shown in further detail in the circuit 400 of FIG. 4. The main portion of the ring VCO is standard, so the rotating injection used to lock it to 50% of the bit-rate with an injection frequency of 40% is entirely a function of the injector mux and the well-known digital divide-by-four ring. Circuit 400 includes a main VCO ring 406, the injector multiplexers 404, and the divide by four ring 402. The divider ring 401 includes two flops (two latches each) with one inversion in the ring so that there can be no single static state, and in every one of the eight repeating states one latch of the four has complementary states for its input and its output, with the latch having the complementary state advancing by one in the ring for each successive state.

Figure 3:
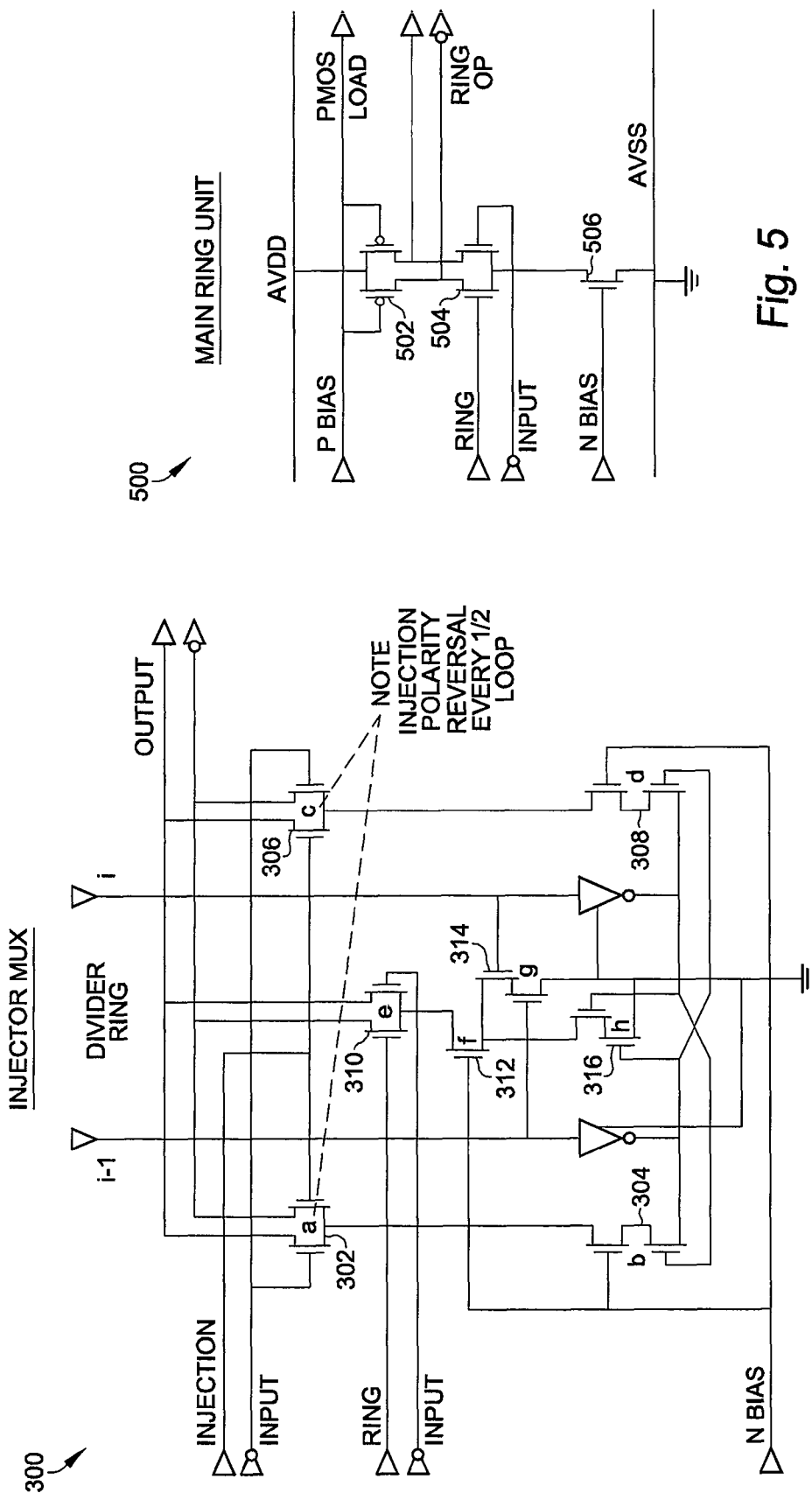
FIG. 3 shows an injector multiplexer circuit associated with the circuit of FIG. 2.

The injector multiplexer circuit 300 is shown in FIG. 3. Each such complementary state causes the injector mux driven by the two complementary signals to select the injection input from the LC tank (differential pair "a" 302, tail current and switch "b" 304), and to invert its polarity for the other complementary state (differential pair "c" 306, tail current and switch "d" 308), while each non-complementary state selects the ring input (differential pair "e" 310, tail current "f" 312, and switches "g" 314 and "h" 316). Inventers 318 and 320 are also shown in FIG. 3. The result is that the injection is applied to each of the four stages successively for each ½ cycle of the injection input signal from the LC PLL, and reverses polarity for each successive cycle. This produces a stable synchronous injection when the ring frequency is ⅝ of the injection frequency, or equivalently when the injection frequency is ⅘ of the ring frequency. To maximize margins for loss of phase lock, it is important for the free-running ring frequency (frequency with no injection) to be as close as possible to the operating ring frequency. The reference ring PLL is intended to produce the optimum bias conditions for other ring VCOs by matching them as closely as possible in terms of frequency vs. bias.

The main ring unit circuit 500 is shown in FIG. 5, which includes P-channel differential pair 502, N-channel differential pair 504, and current generating transistor 506.

A fractional rate LC VCO and compensating divider to avoid bit-rate interference has been shown and described in a preferred embodiment thereof.

In SerDes applications where an LC PLL, i.e., a PLL using a VCO having an inductor (L) and capacitor (C) to form a relatively high Q resonant tank oscillator, is used to reduce clock jitter and noise, a fractional divider can minimize potentially large jitter caused by coupling from data-path signals and harmonics at frequencies slightly offset from that of the LC tank. The inductor of such a tank is relatively large and carries high resonant currents of roughly Q times the tank drive current; hence, it generates relatively high and long range coupling with nearby conductors. Furthermore, the thickness of the conductors and substrate in IC processes is generally much less than their skin depths (exponential decay factor vs. depth) at the frequencies of interest, making them ineffective for magnetic shielding, particularly given the many gaps and few large unbroken metal areas.

A master LC oscillator for a SerDes application must maintain very low jitter, typically less than 0.5 ps rms. This and the former factors mean it is necessary to operate an LC VCO at frequencies where interference from the nearby circuitry and power-rails is minimal. Although an LC tank is a very linear circuit, signals and their harmonics on wires physically near the tank that nearly match the tank frequency can generate large jitter when their frequency difference is within the passband of the LC PLL. CMOS and other circuitry will tend to produce current and voltage spikes at every transition, so produces interference at twice their operating rate and at many integer harmonics of that, mostly odd harmonics, even if differential circuitry is used. Since half rate clocks are commonly used to minimize operating frequencies, bit-rate interference is common, as is direct interference at ½ bit-rate. Other ¼ integer ratios, i.e., 0.75, 1.25, 1.75, 2.25, etc. generally will not result in the tank frequency matching any significant harmonic.

Any significant energy coupling, electrical or magnetic, directly causes timing jitter by acting as an injection-locking signal. Assuming the frequency control loop is able to exert a feedback signal that is much stronger than the injected interfering signal; the PLL will not lose lock but will be subject to being periodically pulled to various different phase positions. If an LC PLL with quality factor "Q" and operating frequency "fo" Hz uses an analog frequency control loop which results in an in-lock bandwidth of "b" Hz, and requires AC drive current "Id" to sustain oscillation by overcoming linear losses, then the AC injection current required to pull its phase by "p" radians p-p is ~Q*Id*p*b/fo. Typical values per radian would be, respectively, 20*2 mA*1 MHz/15 GHz=2 mA*0.00133=2.67 uA. As can be seen, only a very small injection at or very near the tank frequency is needed to cause a sizable phase shift or jitter, i.e., in this example, only 0.133% mutual coupling coefficient from a 2 mA AC interfering current of appropriate rate would be able to pull the VCO phase by 1 radian p-p, or 15.9% of a cycle. This means p-p jitter of up to ~10% of a bit period if the VCO operates at 1.5 times the bit-rate, which is equal or more than typically acceptable for a SerDes device.

The use of any N≥3 and any M>4, or any N>4 and any M≥3 is possible in the present invention, respecting the following condition: unless the LC-VCO frequency falls too close to any of the spectral components of the pulling signal, considering the power-spectrum spread around each component—shaped by jitter on the pulling signal. N and M should be greater than two due to the fact that the ring VCO needs a minimum of three stages. The combination ⅘ is mathematically equivalent to ⅔, but it is limited by the maximum tunable frequency of a ring VCO with a higher number of stages. The combinations N, M>4 are applicable with the consideration of both limiting factors.

In summary the use of two matched in ratio ring VCOs, by the number of delay units, to achieve a given PVT independent frequency ratio, differ from one. Frequency multiplication and division are both possible and both in a fractional ratio. The circuit and method of the present invention are based on the use of a phase-locked loop to generate a common tuning signal for both matched in ratio ring VCOs synchronizing the first ring VCO to a reference frequency. Based on the use of injection-pulling, rotating its location in the second ring VCO, synchronous with the same reference frequency, synchronizing the second ring VCO to the shifted given ratio frequency, thus the exact frequency ratio is maintained.

It will be apparent to those skilled in the art, therefore, that various modifications and variations can be made to the invention without departing from the spirit or scope of the invention. Thus, it is intended that the present invention covers the modifications and variations of this invention provided they come within the scope of the appended claims.

We claim:

1. A circuit comprising:
    an LC PLL having an input for receiving a reference clock signal;
    an N-stage ring VCO with rotating injection having an input coupled to an output of the LC PLL and an output for providing an output clock signal;
    a first divider circuit having an input coupled to an output of the N-stage ring VCO and an output coupled to the LC PLL;
    a second divider circuit having an input coupled to the output of the LC PLL; and
    an M-stage reference ring PLL having an input coupled to an output of the second divider and an output coupled to the N-stage ring VCO.

2. The circuit of claim 1 wherein the LC PLL comprises a phase comparator.

3. The circuit of claim 1 wherein the N-stage ring VCO comprises a four-stage ring VCO.

4. The circuit of claim 1 wherein the first divider circuit comprises a divide by 40 divider circuit.

5. The circuit of claim 1 wherein the second divider circuit comprises a divide by 16 divider circuit.

6. The circuit of claim 1 further comprising at least one daisy-chain segment coupled to the output of the N-stage ring VCO.

7. The circuit of claim 1 wherein the N-stage ring VCO comprises a plurality of serially coupled flip-flop circuits.

8. The circuit of claim 1 wherein the N-stage ring VCO comprises a plurality of serially coupled injector multiplexer circuits.

9. The circuit of claim 8 wherein the injector multiplexer circuits each comprise a ring input.

10. The circuit of claim 8 wherein the injector multiplexer circuits each comprise an injection input.

11. The circuit of claim 8 wherein the injector multiplexer circuits each comprise a divider ring input.

12. The circuit of claim 8 wherein the injector multiplexer circuits each comprise an output.

13. The circuit of claim 8 wherein the injector multiplexer circuits each comprise a bias input.

14. The circuit of claim 8 wherein the injector multiplexer circuits each comprise at least three N-channel differential amplifier circuits.

15. The circuit of claim 1 wherein the N-stage ring VCO comprises a plurality of serially coupled main ring units.

16. The circuit of claim 15 wherein each of the main ring units each comprise a ring input.

17. The circuit of claim 15 wherein each of the main ring units each comprise a ring output.

18. The circuit of claim 15 wherein each of the main ring units each comprise coupled P-channel and N-channel differential amplifier circuits.

19. A fractional divider method for avoidance of LC-VCO interference and jitter, the method comprising:
    providing an LC PLL having an input for receiving a reference clock signal;
    providing an N-stage ring VCO with rotating injection having an input coupled to an output of the LC PLL and an output for providing an output clock signal;
    providing a first divider circuit having an input coupled to an output of the N-stage ring VCO and an output coupled to the LC PLL;
    providing a second divider circuit having an input coupled to the output of the LC PLL; and
    providing an M-stage reference ring PLL having an input coupled to an output of the second divider and an output coupled to the N-stage ring VCO.

20. The method of claim 19, wherein one of the VCOs includes a rotating injection circuit.

* * * * *